(12) United States Patent
Chen et al.

(10) Patent No.: US 7,196,375 B2
(45) Date of Patent: Mar. 27, 2007

(54) HIGH-VOLTAGE MOS TRANSISTOR

(75) Inventors: Fu-Hsin Chen, Hsinchu County (TW); Ruey-Hsin Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 10/801,234

(22) Filed: Mar. 16, 2004

(65) Prior Publication Data
US 2005/0205926 A1 Sep. 22, 2005

(51) Int. Cl.
*H01L 29/76* (2006.01)

(52) U.S. Cl. .............. 257/336; 257/341; 257/408

(58) Field of Classification Search ........ 257/210, 257/211, 327, 335, 336, 339, 344, 408, 412, 257/913
See application file for complete search history.

(56) References Cited

U.S. PATENT DOCUMENTS

| 4,537,854 | A | * | 8/1985 | Crivello ............... 430/283.1 |
|---|---|---|---|---|
| 4,599,789 | A | * | 7/1986 | Gasner ............... 438/224 |
| 4,906,588 | A | * | 3/1990 | Harrington, III ....... 438/282 |
| 5,102,815 | A | * | 4/1992 | Sanchez ............... 438/305 |
| 5,254,866 | A | * | 10/1993 | Ogoh .................. 257/369 |
| 5,387,495 | A | * | 2/1995 | Lee et al. ............ 430/315 |
| 5,567,965 | A | | 10/1996 | Kim |
| 5,783,478 | A | * | 7/1998 | Chau et al. .......... 438/592 |
| 5,866,460 | A | * | 2/1999 | Akram et al. ........ 438/306 |
| 6,297,108 | B1 | | 10/2001 | Chu |
| 6,355,955 | B1 | | 3/2002 | Gardner et al. |
| 2001/0012671 | A1 | * | 8/2001 | Hoshino et al. ...... 438/305 |

* cited by examiner

*Primary Examiner*—Thomas L. Dickey
(74) *Attorney, Agent, or Firm*—Hayes and Boone, LLP

(57) ABSTRACT

A method for fabricating a high-voltage MOS transistor. A first doping region with a first dosage is formed in a substrate. A gate structure is formed overlying the substrate and partially covers the first doping region. The substrate is ion implanted using the gate structure as a mask to simultaneously form a second doping region with a second dosage within the first doping region to serve as a drain region and form a third doping region with the second dosage in the substrate to serve as a source region. A channel region is formed in the substrate between the first and third doping regions when the high-voltage MOS transistor is turned on to pass current between the source and drain regions, where a resistance per unit length of the channel region is substantially equal to that of the first doping region. A high-voltage MOS transistor is also disclosed.

18 Claims, 7 Drawing Sheets

HIGH-VOLTAGE MOS TRANSISTOR

FIELD

The present disclosure relates in general to semiconductor devices and, more particularly, to a high-voltage metal-oxide-semiconductor (MOS) transistor and a method for fabricating the same.

BACKGROUND

Many applications for semiconductor devices require power devices, such as a liquid crystal display (LCD) driver IC, which can operate at high-voltage to drive the LCD and at low voltage to drive an associated logic circuit. A double diffused drain MOS (DDDMOS) transistor is a typical power device to sustain the higher operating voltage.

BRIEF DESCRIPTION OF THE DRAWINGS

The present disclosure will become more fully understood from the detailed description given hereinbelow and the accompanying drawings, given by way of illustration only and thus not intended to be limitative of the present disclosure.

DETAILED DESCRIPTION

Figure 1A:
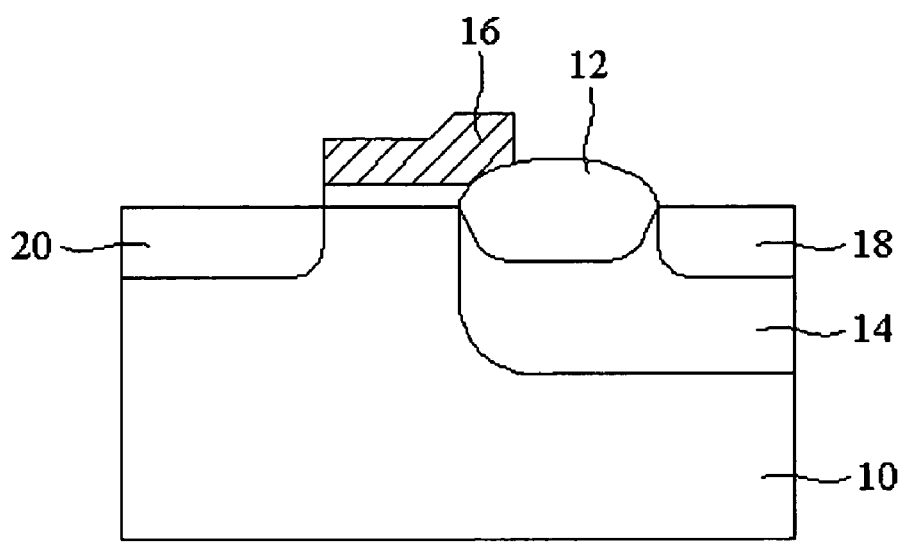
FIGS. 1a to 1b are cross-sections showing exemplary high-voltage MOS transistors.

The present disclosure relates in general to semiconductor devices and, more particularly, to a high-voltage metal-oxide-semiconductor (MOS) transistor and a method for fabricating the same. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A high-voltage MOS transistor with a double diffused drain region is shown in FIG. 1a. A silicon substrate 10 having a thick field oxide 12 formed thereon is provided. A lightly doped region 14 serving as a double diffused drain region (drain extension region) is formed in the substrate 10 beneath the field oxide 12 and around a heavily doped drain region 18 adjacent to the field oxide 12. Another heavily doped source region 20 is formed in the substrate 10 adjacent to the edge of the overlying gate 16. The thick field oxide 12 reduces the electric field in drain region 18 to reduce the high impact generation rate of carriers. However, the field oxide 12 causes the MOS transistor to have undesirably large device dimensions. Moreover, the field oxide 12 also increases the conductive resistance (the resistance between the drain to source when the transistor is turned on, $R_{ON}$) which is also undesirable.

Figure 1B:
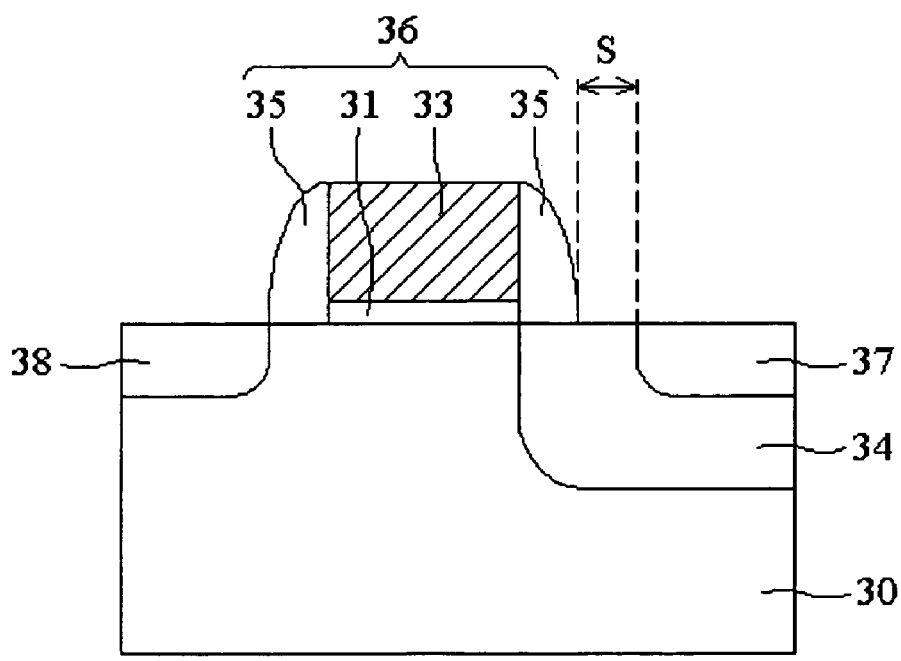

Another high-voltage MOS transistor with a double diffused drain region is shown in FIG. 1b. In the transistor, a gate oxide layer 31 and a two-sided overlying gate 33 are disposed on a silicon substrate 30. A double diffused drain region (drain extension region) 34 is formed in the substrate 30 by ion implantation using the gate 33 as a mask. A gate spacer 35 is formed over the sidewalls of the gate 33 to complete a gate structure 36. A drain region 37 and a source region 38 are respectively formed within the drain extension region 34 on one side of the gate structure 36 and formed in the substrate 30 on the other side of the gate structure 16. There is no field oxide between the gate structure 36 and the drain region 37. Accordingly, such problems as mentioned above can be prevented. However, it is noted that the drain region 37 is separated from the edge of gate structure 36 with a space S. When misalignment occurs during lithography for mask fabrication for drain region 37, the conductive resistance $R_{ON}$ varies with when the size of space S changes. That is, an unstable conductive resistance $R_{ON}$ causes an unstable driving current to reduce the process stability for high-voltage transistor fabrication. In addition, since the double diffused drain region 34 is formed after forming the gate 33, no post high temperature drive in process is allowed as it would affect low voltage operation. Accordingly, the break down voltage of the transistor may not be further improved.

FIGS. 2a to 2e are cross-sections of process steps for the fabrication of an embodiment of a high-voltage MOS transistor of the disclosure. First, in FIG. 2a, a substrate 200, such as an N+ or P+ type silicon substrate or other semiconductor substrate, is provided. The substrate 200 has a well region 202 formed therein by conventional ion implantation. For example, an N-well region can be formed by phosphorus ion implantation with a dosage of about 8.0 to 9.5E12 ions/cm². A P-well region can be formed by boron ion implantation with a dosage of about 6.0 to 7.5E12 ions/cm_2.

Next, selective oxidation may be performed using a patterned silicon nitride layer (not shown) as a mask to form field oxide regions 204 on the substrate 200, thereby defining a device region bounded by field oxide regions 204. Thereafter, a patterned masking layer 206, such as a photoresist layer, having an opening 207 adjacent to one field oxide region 204 to expose a portion of the device region on the substrate 200 is formed overlying the substrate 200 and covers the field oxide regions 204. Ion implantation 208 is subsequently performed using the patterned masking layer 206 as an implanting mask to form a doping region 210 in the device region on the substrate 200. In the disclosure, the doping region 210 can be formed by phosphorus ion implantation with a dosage of about 7.0 to 9.0E12 ions/cm² for NMOS fabrication or formed by boron ion implantation with a dosage of about 6.0 to 7.5E12 ions/cm² for PMOS fabrication.

Figure 2A:
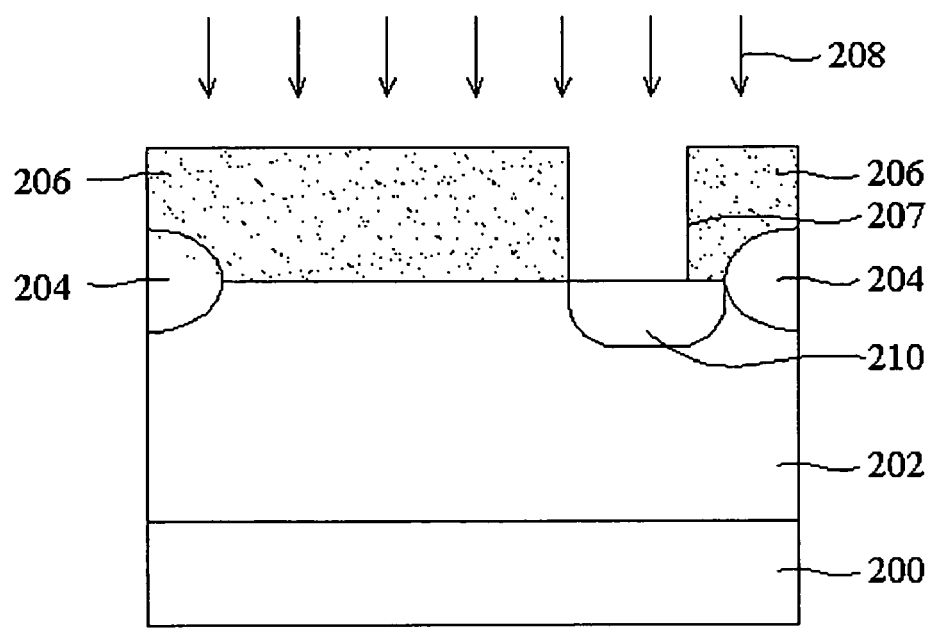
FIGS. 2a to 2e are cross-sections showing a method for fabricating a high-voltage MOS transistor according to an embodiment of the disclosure.
Figure 2B:
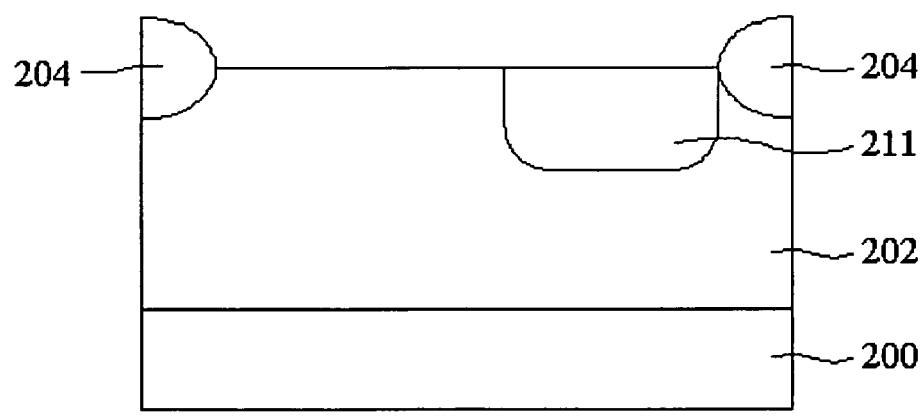

Next, in FIG. 2b, the patterned masking layer 206 is removed. Thereafter, a thermal drive in process is optionally performed on the substrate 200 at a temperature about 1000 to 1100° C. for 6 to 8 hours to form a larger doping region 211 serving as a double diffused drain region (lightly doped drain extension region).

Figure 2C:
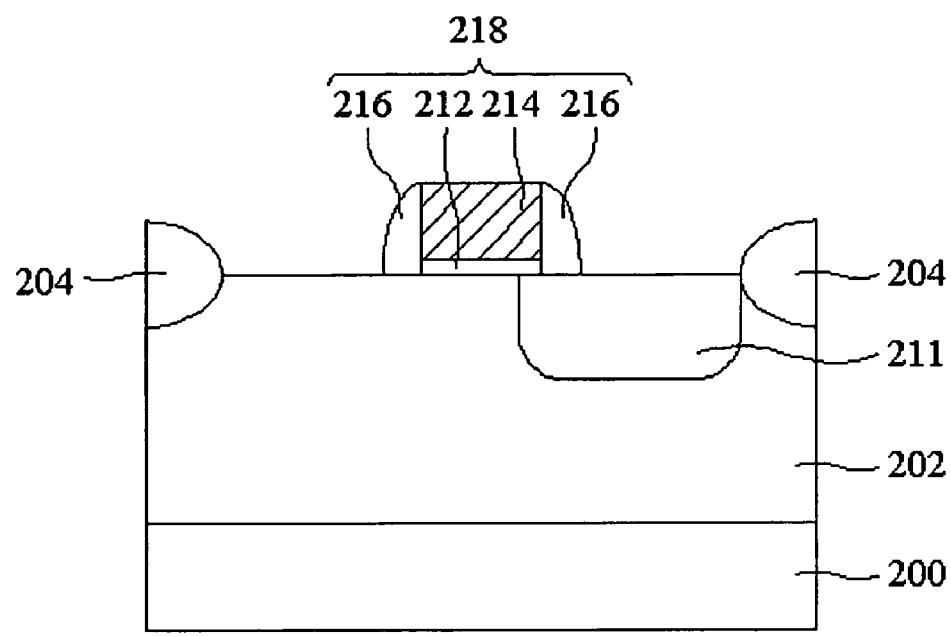

Next, in FIG. 2c, the device region on the substrate 200 is subjected to thermal oxidation in order to form a thin dielectric layer (not shown) thereon. Thereafter, a conductive layer (not shown), such as a polysilicon layer, is deposited on the thin dielectric layer by a deposition technique, for example chemical vapor deposition (CVD). Next, the conductive layer and the underlying thin dielectric layer are patterned by lithography and etching to leave a portion of the conductive layer 214 and a portion of the dielectric layer 212 serving as a gate and a gate dielectric layer, respectively, which partially cover the doping region 211. Next, a conformable dielectric layer (not shown) is deposited on the field oxide regions 204 and the surfaces of the substrate 200 and the gate 214. Anisotropic etching, such as reactive ion etching (RIE), is subsequently performed on the conformable dielectric layer to form a gate spacer 216 on both sides of the gate 214, so as to form a gate structure 218 overlying the substrate 200.

Figure 2D:
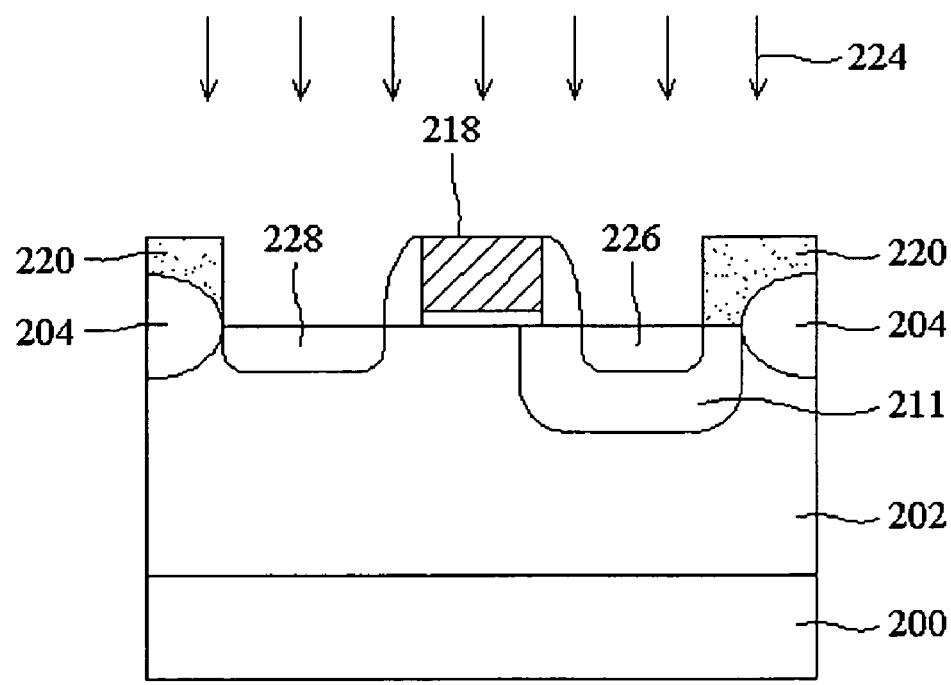

Next, in FIG. 2d, a patterned masking layer 220, such as a photoresist layer, is formed overlying the substrate 200 to cover the field oxide regions 204 and a portion of the doping region 211 near the field oxide region 204. Thereafter, ion implantation 224 is performed on the substrate 200 using the gate structure 218 and the patterned masking layer 220 as an implanting mask to simultaneously form a heavily doped region 226 within the doping region 211 to serve as a drain region and form another heavily doped region 228 in the device region on the substrate 200 to serve as a source region. In this disclosure, the heavily doped regions 226 and 228 can be formed by arsenic ion implantation with a dosage of about 2.0 to 4.0E15 ions/cm$^2$ for NMOS fabrication or formed by germanium ion implantation with a dosage of about 2.0 to 4.0E15 ions/cm$^2$ for PMOS fabrication.

Figure 2E:
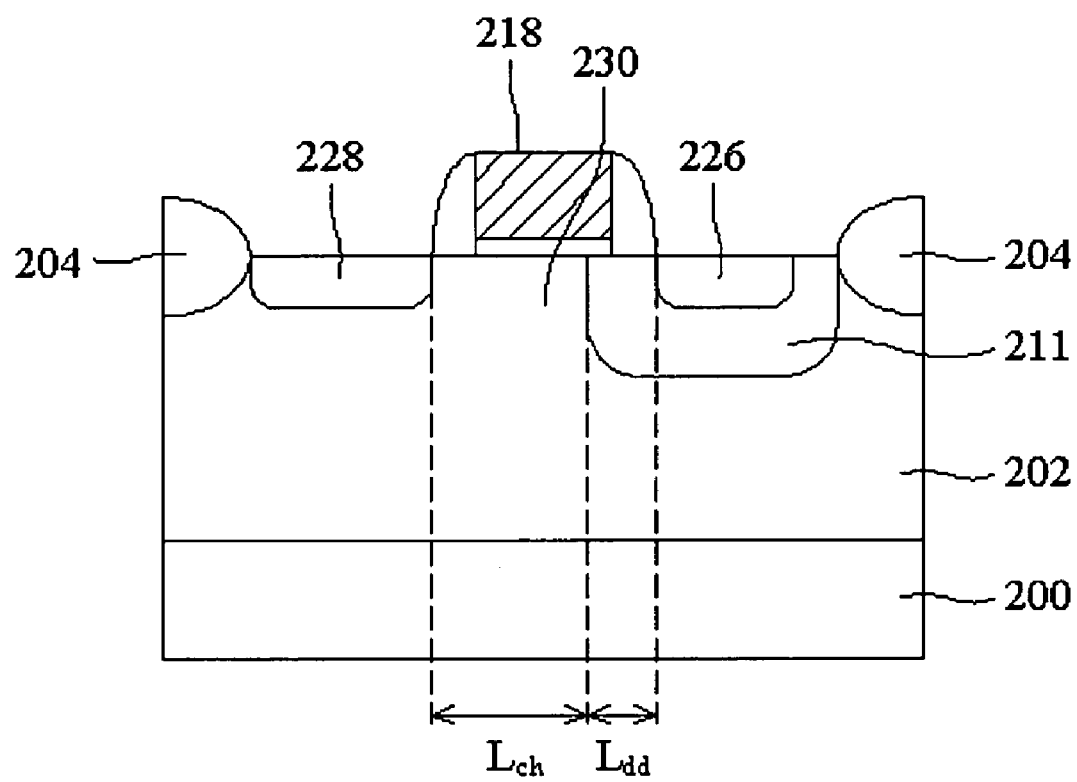

Finally, in FIG. 2e, the patterned masking layer 220 is removed and then a high-voltage MOS transistor of the disclosure is completed. The transistor includes a substrate 200 having a well region 202 formed therein and field oxide regions 204 formed thereon, a gate structure 218, a double diffused drain region 211, a drain region 226, and source region 228. The gate structure 218 comprising a gate dielectric layer 212, an overlying gate 214, and a gate spacer 216 on both sides of the gate 214 is disposed overlying the well region 202 of the substrate 200 and bounded by the field oxide regions 204.

The gate structure 218 has a first side and a second side opposite to the first side. The double diffused drain region 211 is formed in the well region 202 of the substrate 200 on the first side of the gate structure and is partially covered by the gate structure 218. The drain region 226 is formed within the double diffused drain region 211 and adjacent to the edge of the first side of the gate structure 218. The source region 228 is formed in the substrate 200 and adjacent to the edge of the second side of the gate structure 218.

It is noted that a channel region 230 is formed in the well region 202 of the substrate 200 between the source and drain regions 228 and 226 when the high-voltage MOS transistor is turned on to pass current therebetween. The conductive resistance $R_{ON}$ of the high-voltage MOS transistor is:

$$\neq R_{ON} = R_s + L_{ch} \times R_{ch} + L_{dd} \times R_{dd} + R_d$$

Where $R_s$ is the resistance of the source contact (ohm); $R_{ch}$ is the resistance per unit length of the channel region (ohm/μm); $R_{dd}$ is the resistance per unit length of the double diffused drain region (ohm/μm); $L_{ch}$ is a length of the channel region (μm); $L_{dd}$ is a length of an overlap region between the gate structure and the double diffused drain region (μm); and $R_d$ is the resistance of the drain contact (ohm).

When misalignment occurs during lithography for forming the gate 214, the conductive resistance of the transistor is varied due to a shift length (μm) $L_{mis}$ (not shown) of the gate 214. Accordingly, the conductive resistance after misalignment $R_{ON(mis)}$ is:

$$\neq R_{ON(mis)} = R_s + (L_{ch} - L_{mis}) \times R_{ch} + (L_{dd} + L_{mix}) \times R_{dd} + R_d$$

$$\neq R_{ON}$$

In this case, a varied conductive resistance $R_{ON}$ causes an unstable driving current, resulting in reduced process stability for high-voltage transistor fabrication. In the disclosure, however, the resistance per unit length of the channel region $R_{ch}$ can be made substantially equal to the resistance per unit length of the double diffused drain region $R_{dd}$ by previously adjusting the well region 202 implanting dosage and the double diffused drain region 211 implanting dosage. Accordingly, $R_{ch}$ and $R_{dd}$ can be made substantially equal to a fixed value $R_{fix}$. That is, the conductive resistance after misalignment $R_{ON(mis)}$ is:

$$\neq R_{ON(mis)} = R_s + (L_{ch} - L_{mis}) \times R_{ch} + (L_{dd} + L_{mis}) \times R_{dd} + R_d$$

$$i. = R_s + (L_{ch} - L_{mis}) \times R_{fix} + (L_{dd} + L_{mis}) \times R_{fix} + R_d$$

$$ii. = R_s + (L_{ch} + L_{dd}) \times R_{fix} + R_d$$

$$iii. = R_{ON}$$

Therefore, the conductive resistance of the high-voltage MOS transistor of the disclosure does not change even if misalignment occurs, thereby increasing the process stability for high-voltage transistor fabrication.

Moreover, since the double diffused drain region of the disclosure is formed before forming the gate structure, and then source and drain regions are formed by ion implantation using the subsequent gate structure as a mask, a post high temperature drive in process can be performed without affecting low voltage operation, which can form a larger drain extension region to improve breakdown voltage.

Furthermore, because the source and drain regions of the disclosure are formed by a self-alignment method, rather than the conventional non-self-alignment method, the device size can be reduced to increase integration of the integrated circuits.

FIGS. 3a to 3e are cross-sections of process steps for the fabrication of another embodiment of a high-voltage MOS transistor of the disclosure. First, in FIG. 3a, a substrate 300, such as an N+ or P+ type silicon substrate or other semiconductor substrate, is provided. The substrate 300 has a well region 302 formed therein by conventional ion implantation. For example, an N-well region can be formed by phosphorus ion implantation with a dosage of about 8.0 to 9.5E12 ions/cm$^2$. A P-well region can be formed by boron ion implantation with a dosage of about 6.0 to 7.5E12 ions/cm$^2$.

Next, selective oxidation may be performed using a patterned silicon nitride layer (not shown) as a mask to form field oxide regions 304 on the substrate 300, thereby defining a device region bounded by field oxide regions 304. Thereafter, a patterned masking layer 306, such as a photoresist layer, having a pair of openings 307 adjacent to filed oxide regions 304 to expose a portion of the device region on the substrate 300, is formed overlying the substrate 300 and covers the field oxide regions 304. Ion implantation 308 is subsequently performed using the patterned masking layer 306 as an implanting mask to form a pair of doping regions 310 in the device region on the substrate 300. In the disclosure, the doping region 310 can be formed by phosphorus ion implantation with a dosage of about 7.0 to 9.0E12 ions/cm$^2$ for NMOS fabrication or formed by boron ion implantation with a dosage of about 6.0 to 7.5E12 ions/cm$^2$ for PMOS fabrication.

Figure 3A:
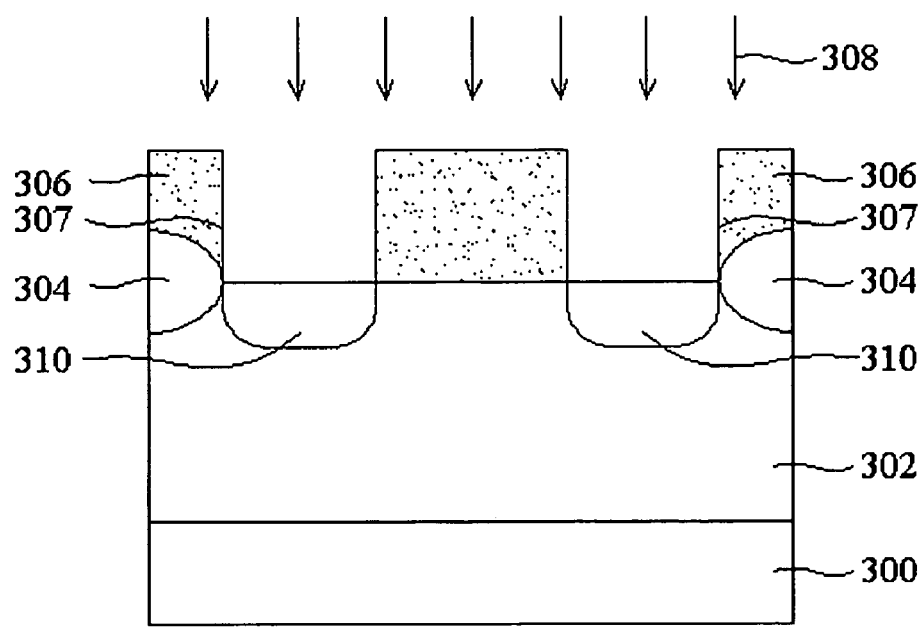
FIGS. 3a to 3e are cross-sections showing a method for fabricating a high-voltage MOS transistor according to another embodiment of the disclosure.
Figure 3B:
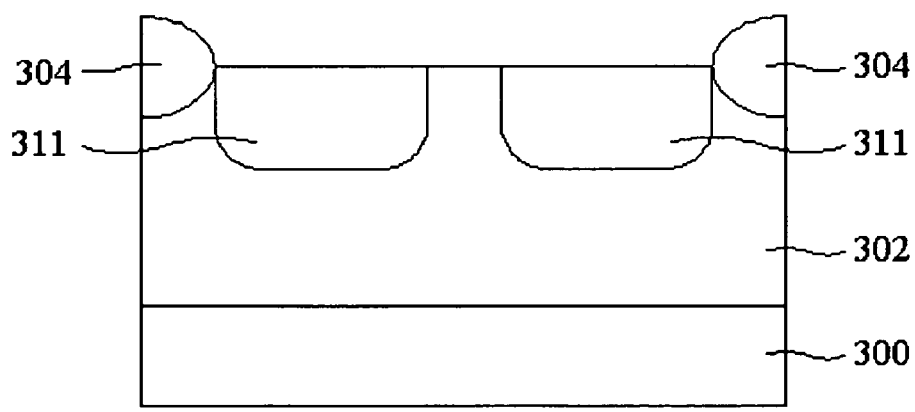

Next, in FIG. 3b, the patterned masking layer 306 is removed. Thereafter, a thermal drive in process is optionally performed on the substrate 300 at a temperature about 1000 to 1100° C. for 6 to 8 hours to form a pair of larger doping regions 311 serving as double diffused drain regions.

Figure 3C:
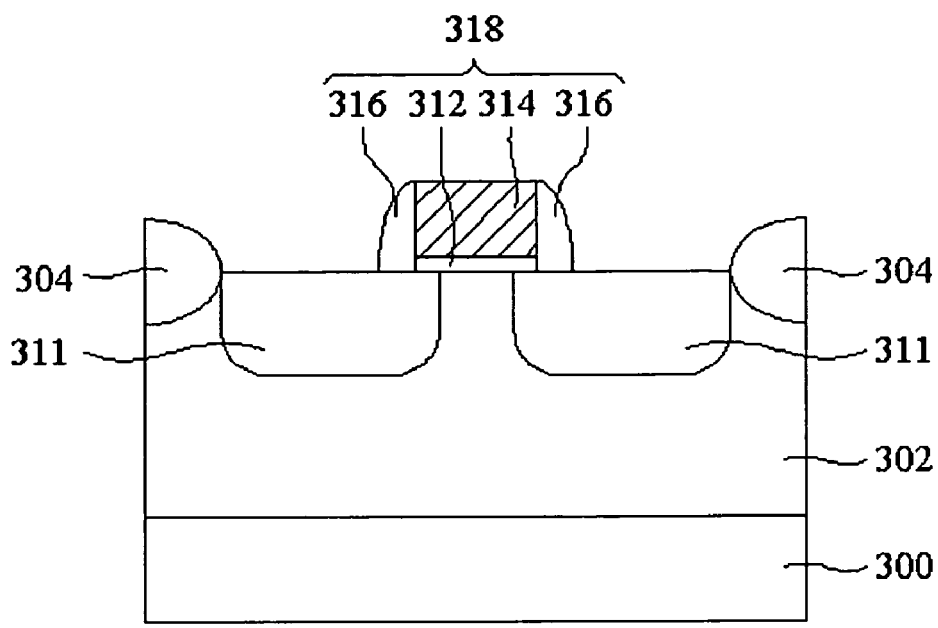

Next, in FIG. 3c, the device region on the substrate 300 is subjected to thermal oxidation in order to form a thin dielectric layer (not shown) thereon. Thereafter, a conductive layer (not shown), such as a polysilicon layer, is deposited on the thin dielectric layer by CVD or other deposition. Next, the conductive layer and the underlying thin dielectric layer are patterned by lithography and etching to leave a portion of the conductive layer 314 and a portion of the dielectric layer 312 serving as a gate and a gate dielectric layer, respectively, which are between the pair of doping regions 311 and partially cover the pair of doping regions 311. Next, a conformable dielectric layer (not shown) is deposited on the field oxide regions 304 and the surfaces of the substrate 300 and the gate 314. Anisotropic etching, such as RIE, is subsequently performed on the conformable dielectric layer to form a gate spacer 316 on both sides of the gate 314, so as to form a gate structure 318 overlying the substrate 300.

Figure 3D:
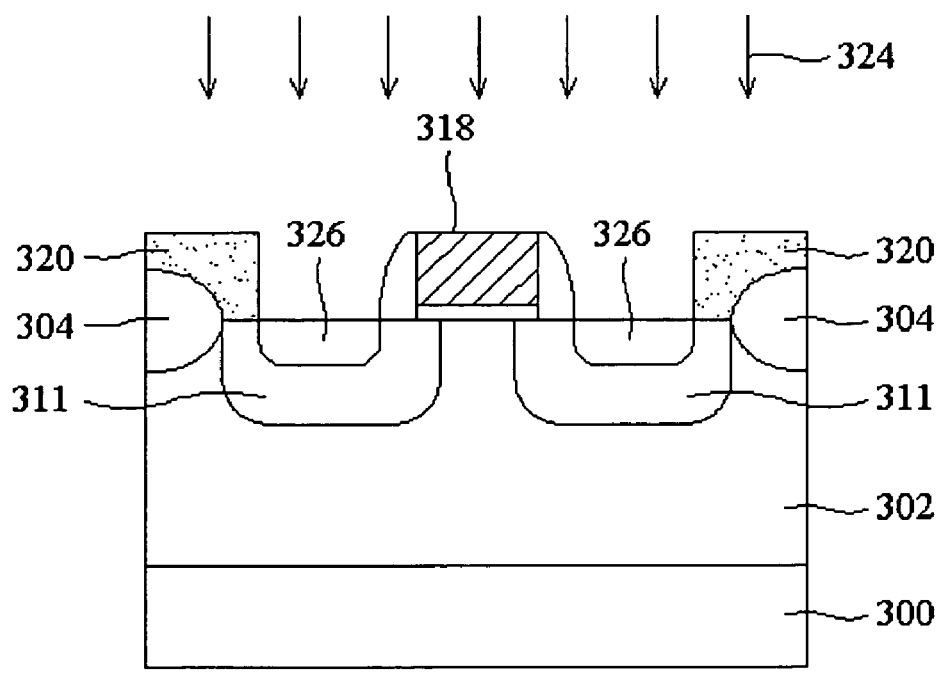

Next, in FIG. 3d, a patterned masking layer 320, such as a photoresist layer, is formed overlying the substrate 300 to cover the field oxide regions 304 and a portion of the pair of doping regions 311 near the field oxide regions 304. Thereafter, ion implantation 324 is performed on the substrate 300 using the gate structure 318 and the patterned masking layer 320 as an implanting mask to form a pair of heavily doped regions 326 within the pair of doping regions 311 to serve as source and drain regions. In this disclosure, the pair of heavily doped regions 326 can be formed by arsenic ion implantation with a dosage of about 2.0 to 4.0E15 ions/cm$^2$ for NMOS fabrication or formed by germanium ion implantation with a dosage of about 2.0 to 4.0E15 ions/cm$^2$ for PMOS fabrication.

Figure 3E:
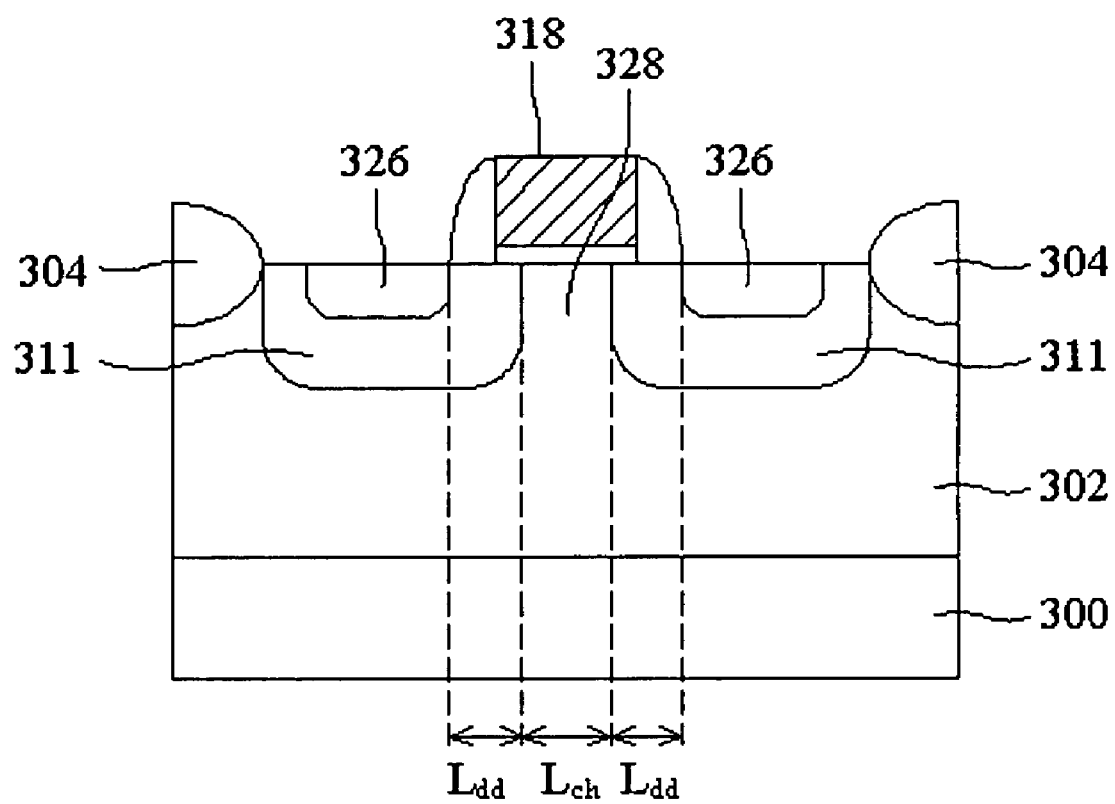

Finally, in FIG. 3e, the patterned masking layer 220 is removed and then a high-voltage MOS transistor of the disclosure is completed. The transistor includes a substrate 300 having a well region 302 formed therein and field oxide regions 304 formed thereon, a gate structure 318, a pair of doping regions 311 and a pair of doping regions 326. The gate structure 318 comprising a gate dielectric layer 312, an overlying gate 314, and a gate spacer 316 on both sides of the gate 314 is disposed overlying the well region 302 of the substrate 300 and bounded by the field oxide regions 304. The pair of doping regions 311 is formed in the substrate 300, one on each side of the gate structure 318, and each is partially covered by the gate structure 318. The pair of doping regions 326 is formed within the pair of doping regions 311, one adjacent to the edge of each side of gate structure 318, to serve as source and drain regions.

As mentioned above, a channel region 328 is formed in the well region 302 of the substrate 300 between the source and drain regions 326 when the high-voltage MOS transistor is turned on to pass current therebetween. The conductive resistance $R_{ON}$ of the high-voltage MOS transistor is:

$$\neq R_{ON} = R_s + L_{dd} \times R_{dd} + L_{ch} \times R_{ch} + L_{dd} \times R_{dd} + R_d$$

$$\neq = R_s + 2L_{dd} \times R_{dd} + L_{ch} \times R_{ch} + R_d$$

When misalignment occurs during lithography for forming the gate 314, the conductive resistance after misalignment $R_{ON(mis)}$ is:

$$\neq R_{ON(mis)} = R_s + (L_{dd} - L_{mis}) \times R_{dd} + (L_{ch} - L_{mis}) \times R_{ch} + (L_{dd} + L_{mis}) \times R_{dd} + R_d$$

i. $= R_s + 2L_{dd} \times R_{dd} + L_{ch} \times R_{ch} + R_d$ ii. $= R_{ON}$

Therefore, the conductive resistance $R_{ON}$ can be maintained at a fixed value even if misalignment occurs, thereby obtaining a stable driving current to increase the process stability for high-voltage transistor fabrication.

Moreover, since the double diffused drain region of the disclosure is formed before forming the gate structure, and then source and drain regions are formed by ion implantation using the subsequent gate structure as a mask, a post high temperature drive in process can be performed on the substrate without affecting low voltage operation, thus forming a larger drain extension region and improving breakdown voltage.

Furthermore, as the source and drain regions of the disclosure are formed by a self-alignment method, rather than the conventional non-self-alignment method, the device size can be reduced to increase integration of the integrated circuits.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the disclosure.

What is claimed is:

1. A high-voltage MOS transistor comprising:
   a substrate;
   a gate structure overlying the substrate, the gate structure having a first side and a second side opposite to the first side;
   a first doping region with a first dosage formed in the substrate on the first side of the gate structure and partially covered by the gate structure;
   a second doping region with a second dosage formed within the first doping region adjacent to the edge on the first side of the gate structure to serve as a drain region and a third doping region with the second dosage formed in the substrate adjacent to the edge of the second side of the gate structure to serve as a source region; and
   a channel region formed in the substrate between the first and third doping regions by turning on the high-voltage MOS transistor to pass current between the source and drain regions, where a resistance per unit length of the channel region is substantially equal to a resistance per unit length of the first doping region,
   wherein the first dosage is about 7.0 to 9.0E12 ions/cm$^2$.

2. The device as claimed in claim 1, wherein the second dosage is about 2.0 to 4.0E15 ions/cm$^2$.

3. A high-voltage MOS transistor comprising:
   a first drain region with a first dosage formed in a substrate, wherein the first drain region extends horizontally from a first point proximate to an upper surface of the substrate to a second point proximate to the upper surface;
   a first source region with the first dosage formed in the substrate, wherein the first source region extends horizontally from a third point proximate to an upper surface of the substrate to a fourth point proximate to the upper surface;

a gate structure overlying the substrate, interposed between the first drain region and the first source region, covering a portion of the first drain region extending from the first point to a fifth point of the first drain region located between the first and second points, and covering a portion of the first source region extending from the third point to a sixth point of the first source region located between the third and fourth points;

a first spacer in contact with the gate structure and covering a portion of the first drain region from the fifth point to a seventh point of the first drain region located between the fifth and second points;

a second spacer in contact with the gate structure and covering a portion of the first source region from the sixth point to an eighth point of the first source region located between the sixth and fourth points;

a second drain region with a second dosage formed within the first drain region, wherein the second drain region extends substantially from the seventh point to a ninth point of the first drain region located between the seventh and second points, and wherein the portion of the first drain region extending from the ninth point to the second point is at substantially the same horizontal level in the substrate as the first point; and a second source region with the second dosage formed within the first source region, wherein the second source region extends substantially from the eighth point to a tenth point of the first source region located between the eighth and fourth points, and wherein the portion of the first source region extending from the tenth point to the fourth point is at substantially the same horizontal level in the substrate as the third point;

wherein a channel region formed in the substrate between the first drain region and the first source region has a resistance per unit length that is substantially equal to a resistance per unit length of the first drain region.

4. The high-voltage MOS transistor of claim 3 further comprising a field oxide layer substantially abutting the first doped region at the second point.

5. A high-voltage MOS transistor comprising:

a first drain region with a first dosage formed in a substrate, wherein the first drain region extends horizontally from a first point proximate to an upper surface of the substrate to a second point proximate to the upper surface;

a gate structure overlying the substrate and covering a portion of the first drain region extending from the first point to a third point of the first drain region located between the first and second points;

a spacer in contact with the gate structure and covering a portion of the first drain region from the third point to a fourth point of the first drain region located between the third and second points;

a second drain region with a second dosage formed within the first drain region, wherein the second drain region extends substantially from the fourth point to a fifth point of the first drain region located between the fourth and second points, and wherein the portion of the first drain region extending from the fifth point to the second point is at substantially the same horizontal level in the substrate as the first point; and a source region formed in a substrate on the opposite side of the gate structure from the first drain region, wherein a channel region formed in the substrate between the first drain region and source region has a resistance per unit length that is substantially equal to a resistance per unit length of the first drain region, wherein the first drain region has a doping concentration of approximately 7.0 to 9.0E12 ions/cm$^2$.

6. A high-voltage MOS transistor comprising:

a first drain region with a first dosage formed in a substrate, wherein the first drain region extends horizontally from a first point proximate to an upper surface of the substrate to a second point proximate to the upper surface;

a gate structure overlying the substrate and covering a portion of the first drain region extending from the first point to a third point of the first drain region located between the first and second points;

a spacer in contact with the gate structure and covering a portion of the first drain region from the third point to a fourth point of the first drain region located between the third and second points;

a second drain region with a second dosage formed within the first drain region, wherein the second drain region extends substantially from the fourth point to a fifth point of the first drain region located between the fourth and second points, and wherein the portion of the first drain region extending from the fifth point to the second point is at substantially the same horizontal level in the substrate as the first point; and a source region formed in a substrate on the opposite side of the gate structure from the first drain region, wherein a channel region formed in the substrate between the first drain region and source region has a resistance per unit length that is substantially equal to a resistance per unit length of the first drain region, wherein the second drain region has a doping concentration of approximately 2.0 to 4.0E15 ions/cm$^2$.

7. A high-voltage MOS transistor comprising:

a first drain region and a first source region formed in a substrate and spaced from each other;

a gate structure overlying the substrate, interposing between the first drain region and the first source region, and covering a first portion of the first drain region and a first portion of the first source region;

a first spacer in contact with the gate structure and covering a second portion of the first drain region adjacent to the first portion of the first drain region;

a second spacer in contact with the gate structure and covering a second portion of the first source region adjacent to the first portion of the first source region;

a second drain region formed within the first drain region, wherein the second drain region extends substantially from the second portion of the first drain region in the direction opposite the gate structure and the first spacer, wherein the portion of the first drain region extending beyond the second drain region is at substantially the same horizontal level in the substrate as the first portion of the first drain region; and a second source region formed within the first drain region, wherein the second source region extends substantially from the second portion of the first source region in the direction opposite the gate structure and the second spacer, wherein the portion of the first source region extending beyond the second source region is at substantially the same horizontal level in the substrate as the first portion of the first source region, wherein a channel region formed in the substrate between the first drain region and the first source region has a resistance per unit length that is substantially equal to a resistance per unit length of the first drain region.

8. A high-voltage MOS transistor comprising:
a substrate;
a gate structure overlying the substrate, the gate structure having a first side and a second side opposite to the first side;
a first doping region with a first dosage formed in the substrate on the first side of the gate structure and partially covered by the gate structure;
a second doping region with a second dosage formed within the first doping region adjacent to the edge on the first side of the gate structure to serve as a drain region, the second doping region is offset from the first doping region at least by a first gate spacer;
a third doping region with the first dosage formed in the substrate on the second side of the gate structure and partially covered by the gate structure;
a fourth doping region with the second dosage formed within the third doping region adjacent to the edge on the second side of the gate structure to serve as a source region, the fourth doping region is offset from the third doping region at least by a second gate spacer; and
a channel region formed in the substrate between the first and third doping regions by turning on the high-voltage MOS transistor to pass current between the source and drain regions, where a resistance per unit length of the channel region is substantially equal to a resistance per unit length of the first doping region.

9. A transistor apparatus, comprising:
a gate structure located over a substrate;
a first doped region located in the substrate on a first side of the gate structure and partially underneath the gate structure, the first doped region formed with a dosage ranging between about 7.0E12 ions/cm$^2$ and about 9.0E12 ions/cm$^2$;
a second doped region located in the first doped region adjacent an edge on the first side of the gate structure;
a third doped region located in the substrate adjacent an edge on a second side of the gate structure; and
a channel region located in the substrate between the first and third doped regions and having a resistance per unit length that is substantially equal to a resistance per unit length of the first doped region.

10. The transistor apparatus of claim 9 wherein at least one of the first and second doped regions is a drain region of the transistor apparatus and the third doped region is a source region of the transistor apparatus.

11. The transistor apparatus of claim 9 wherein the gate structure comprises a gate, a gate dielectric layer, and a gate spacer.

12. The transistor apparatus of claim 11 wherein a portion of the perimeter of the first doped region is substantially adjacent a portion of the perimeter of the gate dielectric layer, and wherein a portion of the perimeter of the second doped region is substantially adjacent a portion of the outer perimeter of the gate spacer.

13. The transistor apparatus of claim 9 wherein the first doped region is a phosphorous ion implanted region.

14. The transistor apparatus of claim 9 wherein the second doped region and the third doped region are formed with substantially similar dosages.

15. The transistor apparatus of claim 9 wherein at least one of the second and third doped regions is formed with a dosage ranging between about 2.0E15 ions/cm$^2$ and about 4.0E15 ions/cm$^2$.

16. The transistor apparatus of claim 9 wherein the second and third doped regions are each formed with a dosage ranging between about 2.0E15 ions/cm$^2$ and about 4.0E15 ions/cm$^2$.

17. The transistor apparatus of claim 9 wherein at least one of the second and third doped regions is an arsenic ion implanted region.

18. The transistor apparatus of claim 9 wherein at least one of the second and third doped regions is a germanium ion implantation region.

* * * * *